(12) United States Patent
Park et al.

(10) Patent No.: US 11,004,889 B2
(45) Date of Patent: May 11, 2021

(54) METHOD OF FABRICATING IMAGE SENSOR

(71) Applicant: SAMSUNG ELECTRONICS CO., LTD., Suwon-si (KR)

(72) Inventors: Sang-Su Park, Seoul (KR); Kwansik Kim, Seoul (KR); Yoonkyoung Kim, Seoul (KR); Changhwa Kim, Hwaseong-si (KR); Mangeun Cho, Suwon-si (KR); Hyungi Hong, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/658,855

(22) Filed: Oct. 21, 2019

(65) Prior Publication Data
US 2020/0219928 A1    Jul. 9, 2020

(30) Foreign Application Priority Data

Jan. 7, 2019  (KR) .................. 10-2019-0001941

(51) Int. Cl.
| H01L 27/146 | (2006.01) |
| H01L 21/762 | (2006.01) |
| H01L 21/223 | (2006.01) |
| H01L 21/225 | (2006.01) |

(52) U.S. Cl.
CPC .... *H01L 27/14698* (2013.01); *H01L 21/2236* (2013.01); *H01L 21/76227* (2013.01); *H01L 21/2252* (2013.01); *H01L 21/76237* (2013.01); *H01L 27/14621* (2013.01); *H01L 27/14627* (2013.01); *H01L 27/14683* (2013.01)

(58) Field of Classification Search
CPC ......... H01L 27/14698; H01L 21/76227; H01L 21/2236; H01L 21/2252; H01L 27/14627; H01L 27/14621; H01L 27/14683
USPC .......................................................... 438/57
See application file for complete search history.

(56) References Cited

U.S. PATENT DOCUMENTS

| 7,091,536 | B2 | 8/2006 | Rhodes et al. |
| 7,354,841 | B2 | 4/2008 | Jeon |
| 7,491,561 | B2 | 2/2009 | Adkisson et al. |
| 9,385,156 | B2 | 7/2016 | Tsai et al. |
| 9,553,119 | B2 * | 1/2017 | Choi ................. H01L 27/14685 |
| 10,432,883 | B1 * | 10/2019 | Chapman .......... H01L 27/14623 |
| 2015/0115388 | A1 * | 4/2015 | Eda ..................... H01L 27/1464 257/446 |
| 2018/0061873 | A1 | 3/2018 | Lee et al. |

FOREIGN PATENT DOCUMENTS

KR    10-2011-0077409 A    7/2011

* cited by examiner

*Primary Examiner* — Vu A Vu
(74) *Attorney, Agent, or Firm* — Sughrue Mion, PLLC

(57) ABSTRACT

A method of fabricating an image sensor is provided. The method includes comprises forming a deep trench in a semiconductor substrate, performing a first plasma doping process to form a first impurity region a portion of in the semiconductor substrate adjacent to inner sidewalls and a bottom surface of the deep trench, the first impurity region being doped with first impurities of a first conductivity type, and performing an annealing process to diffuse the first impurities from the first impurity region into the semiconductor substrate to form a photoelectric conversion part.

18 Claims, 18 Drawing Sheets

METHOD OF FABRICATING IMAGE SENSOR

CROSS-REFERENCE TO RELATED APPLICATION

This application claims priority under 35 U.S.C § 119 to Korean Patent Application No. 10-2019-0001941 filed on Jan. 7, 2019 in the Korean Intellectual Property Office, the entire contents of which are hereby incorporated by reference.

BACKGROUND

The present disclosure relates to a method of fabricating an image sensor.

An image sensor is a semiconductor device to convert optical images into electrical signals. An image sensor can be classified into a charge-coupled device (CCD) type and a complementary metal-oxide-semiconductor (CMOS) type. A CMOS-type image sensor (CIS) has a plurality of two-dimensionally arranged pixels. Each of the pixels includes a photodiode that converts incident light into electrical signals.

SUMMARY

One or more example embodiments provide a method of fabricating an image sensor including a photoelectric conversion part whose impurity concentration is uniform throughout the photoelectron conversion part.

According an aspect of an example embodiment, a method of fabricating an image sensor may include: forming a deep trench in a semiconductor substrate; performing a first plasma doping process to form a first impurity region in a portion of the semiconductor substrate adjacent to inner sidewalls and a bottom surface of the deep trench, the first impurity region being doped with first impurities of a first conductivity type; and performing an annealing process to diffuse the first impurities from the first impurity region into the semiconductor substrate to form a photoelectric conversion part.

According to an aspect of another example embodiment, a method of fabricating an image sensor may include: forming a deep trench in a semiconductor substrate; forming a first impurity region in a portion of the semiconductor substrate adjacent to inner sidewalls and a bottom surface of the deep trench, the first impurity region being doped with first impurities of a first conductivity type; and performing an annealing process to diffuse the first impurities from the first impurity region into the semiconductor substrate to form a photoelectric conversion part.

According to an aspect of another example embodiment, a method of fabricating an image sensor may include: forming a deep trench and a through hole that are spaced apart from each other in a semiconductor substrate; forming a first impurity region in a portion the semiconductor substrate adjacent to inner sidewalls and a bottom surface of the deep trench, the first impurity region being doped with first impurities of a first conductivity type; forming a second impurity region in another portion of the semiconductor substrate adjacent to inner sidewalls and a bottom surface of the through hole, the second impurity region being doped with the first impurities; and performing an annealing process to diffuse the first impurities from the first impurity region and the second impurity region into the semiconductor substrate to form a photoelectric conversion part.

BRIEF DESCRIPTION OF THE DRAWINGS

The above and/or other aspects will be more clearly understood from the following detailed description taken in conjunction with the accompanying drawings in which.

DETAILED DESCRIPTION

Some example embodiments will now be described in detail with reference to the accompanying drawings.

Figure 1:
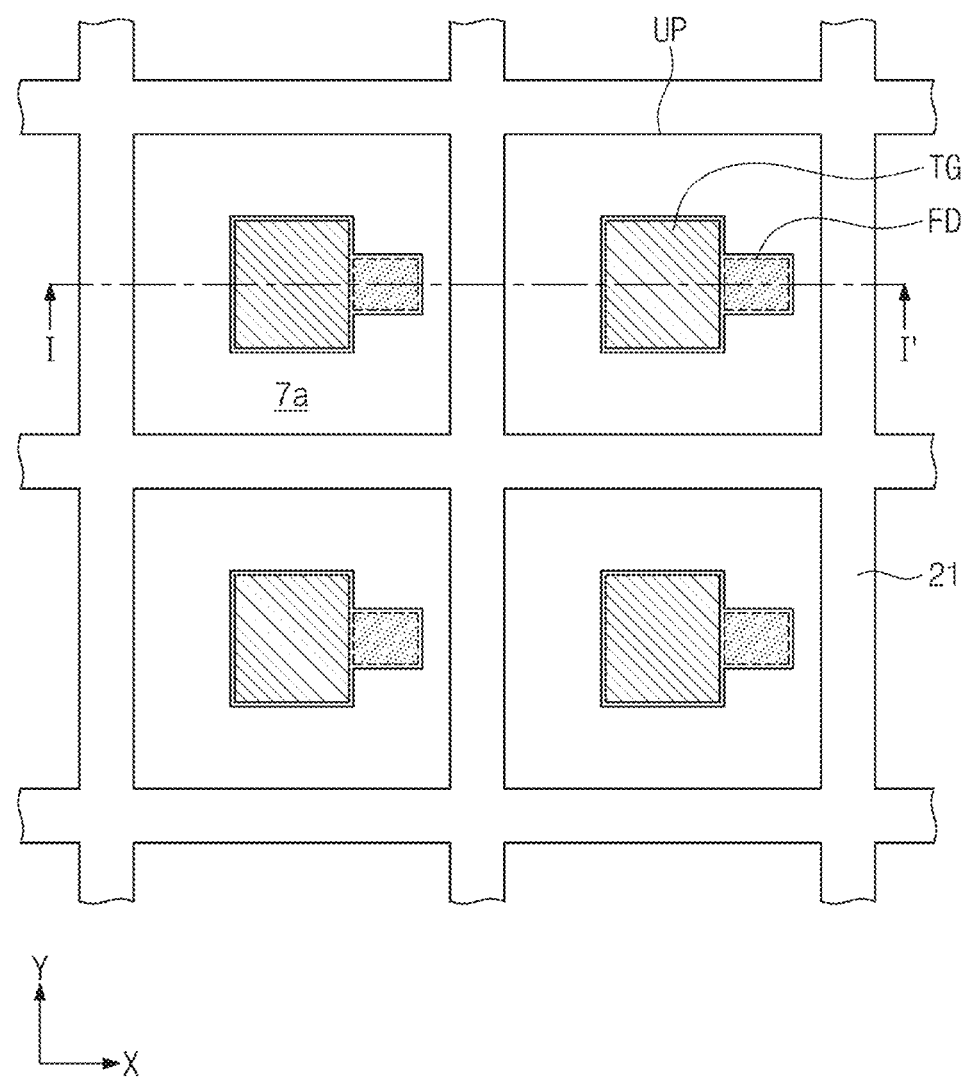
FIG. 1 illustrates a plan view showing an image sensor according an example embodiment.
Figure 2:
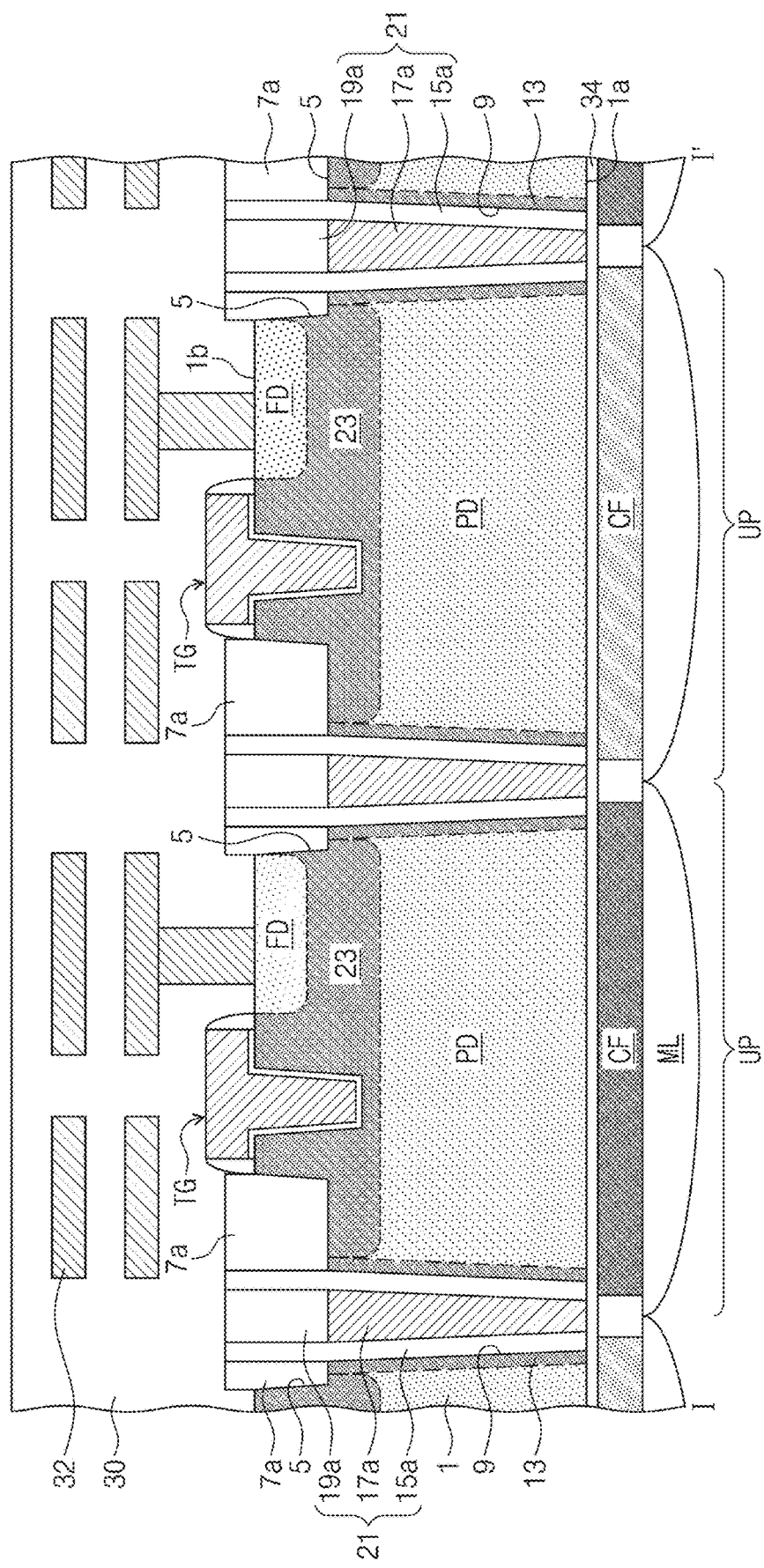
FIG. 2 illustrates a cross-sectional view taken along line I-I' of FIG. 1.

FIG. 1 illustrates a plan view showing an image sensor according to according to an example embodiment. FIG. 2 illustrates a cross-sectional view taken along line I-I' of FIG. 1.

Referring to FIGS. 1 and 2, an image sensor according to the present embodiment may include a semiconductor substrate 1. The semiconductor substrate 1 may have a first surface 1a and a second surface 1b that face each other. For example, the first surface 1a may be a side on which light is incident and the second surface 1b may be a side on which transistors are disposed. The semiconductor substrate 1 may be, for example, a single crystalline silicon wafer or an epitaxial silicon layer. The semiconductor substrate 1 may be provided therein with a deep device isolation part 21 that separates a plurality of pixel regions UP from each other. The deep device isolation part 21 may have a grid shape extending in a first direction X and a second direction Y, when viewed in plan. The deep device isolation part 21 may penetrate the semiconductor substrate 1. The deep device isolation part 21 may be disposed in a deep trench 9. The deep device isolation part 21 may include a polysilicon pattern 17a disposed in the deep trench 9 and spaced apart from the semiconductor substrate 1. The polysilicon pattern 17a may include impurities doped therein. The polysilicon pattern 17a may have a top surface adjacent to and lower than the second surface 1b. The deep device isolation part 21 may further include a capping pattern 19a on the polysilicon pattern 17a. The deep device isolation part 21 may further include a dielectric pattern 15a between the polysilicon pattern 17a and the semiconductor substrate 1 and between the capping pattern 19a and the semiconductor substrate 1. The dielectric pattern 15a and the capping pattern 19a may have a single-layered or multi-layered structure including one or more of a silicon oxide layer, a silicon nitride layer, and a silicon oxynitride layer.

The semiconductor substrate 1 may be provided on its second surface 1b with a shallow device isolation part 7a defining active regions for transistors. The shallow device isolation part 7a may have a single-layered or multi-layered structure including one or more of a silicon oxide layer, a silicon nitride layer, and a silicon oxynitride layer. The deep device isolation part 21 may penetrate a portion of the shallow device isolation part 7a. The shallow device isolation part 7a may be disposed in a shallow trench 5 adjacent to the second surface 1b. The top surface of the polysilicon pattern 17a may be located at a height (or level) that is the same as that of a bottom surface of the shallow device isolation part 7a. A top surface of the shallow device isolation part 7a and a top surface of the deep device isolation part 21 may protrude from of the second surface 1b of the semiconductor substrate 1. The shallow device isolation part 7a, the capping pattern 19a, and the dielectric pattern 15a may have their top surfaces coplanar with each other.

A photoelectric conversion part PD may be provided in the semiconductor substrate 1. The photoelectric conversion part PD may be, for example, an area doped with first impurities of a first conductivity type. The first impurities in the photoelectric conversion part PD may have a concentration that is uniform throughout the photoelectric conversion part PD. The first impurities of the first conductivity type may be, for example, N-type arsenic or phosphorus. The photoelectric conversion part PD may reach the first surface 1a of the semiconductor substrate 1.

An electron suppression region 13 doped with second impurities of a second conductivity type may be provided between the photoelectric conversion part PD and a sidewall of the deep device isolation part 21 may be provided therebetween with. The second impurities of the second conductivity type may be, for example, P-type boron. The electron suppression region 13 may separate the photoelectron conversion part PD from the deep device isolation part 21. The electron suppression region 13 may have a uniform width along the sidewall of the deep device isolation part 21, and may extend from the first surface 1a of the semiconductor substrate 1 to the bottom surface of the shallow device isolation part 7a. The electron suppression region 13 may prevent the photoelectric conversion part PD from receiving electrons trapped by dangling bonds possibly present on inner sidewalls of the deep trench 9, which may result in an improvement in dark current or white spots.

The semiconductor substrate 1 may be provided therein with a well region 23 adjacent to the second surface 1b. The well region 23 may be an area doped with second impurities of the second conductivity type. The well region 23 may be in contact with the electron suppression region 13. The second impurities doped in the electron suppression region 13 may have a concentration equal to or greater than that of the second impurities doped in the well region 23. The photoelectric conversion part PD and both of the well region 23 and the electron suppression region 13 may form a p-n junction to constitute a photodiode.

A transfer gate electrode TG may be disposed on the second surface 1b of the semiconductor substrate 1. A portion of the transfer gate electrode TG may extend into the well region 23. A floating diffusion region FD may be disposed in the semiconductor substrate 1 adjacent to the transfer gate electrode TG. The floating diffusion region FD may be doped with first impurities of the first conductivity type. The well region 23 may separate the flowing diffusion region FD from the photoelectric conversion part PD.

The second surface 1b of the semiconductor substrate 1 may be covered with an interlayer dielectric layer 30. The interlayer dielectric layer 30 may have a single-layered or multi-layered structure including one or more of a silicon oxide layer, a silicon oxynitride layer, and a silicon nitride layer. The interlayer dielectric layer 30 may be provided therein with multi-layered connection lines 32.

The first surface 1a of the semiconductor substrate 1 may be covered with a fixed charge layer 34. The fixed charge layer 34 may include either a metal oxide layer including oxygen whose amount is less than its stoichiometric ratio or a metal fluoride layer including fluorine whose amount is less than its stoichiometric ratio. The fixed charge layer 34 may thus have a negative fixed charge. The fixed charge layer 34 may be made of one of metal oxide and metal fluoride that include at least one metal selected from the group consisting of hafnium (Hf), zirconium (Zr), aluminum (Al), tantalum (Ta), titanium (Ti), yttrium (Y), and lanthanides. The fixed charge layer 34 may suppress or reduce dark current and white spots. The fixed charge layer 34 may be in contact with the photoelectric conversion part PD. The fixed charge layer 34 may be provided thereunder with color filters CF and micro-lenses ML that are disposed in an array format.

FIGS. 3A to 3J illustrate cross-sectional views showing a method of fabricating an image sensor having the cross-section of FIG. 2 according to an example embodiment.

Figure 3A:
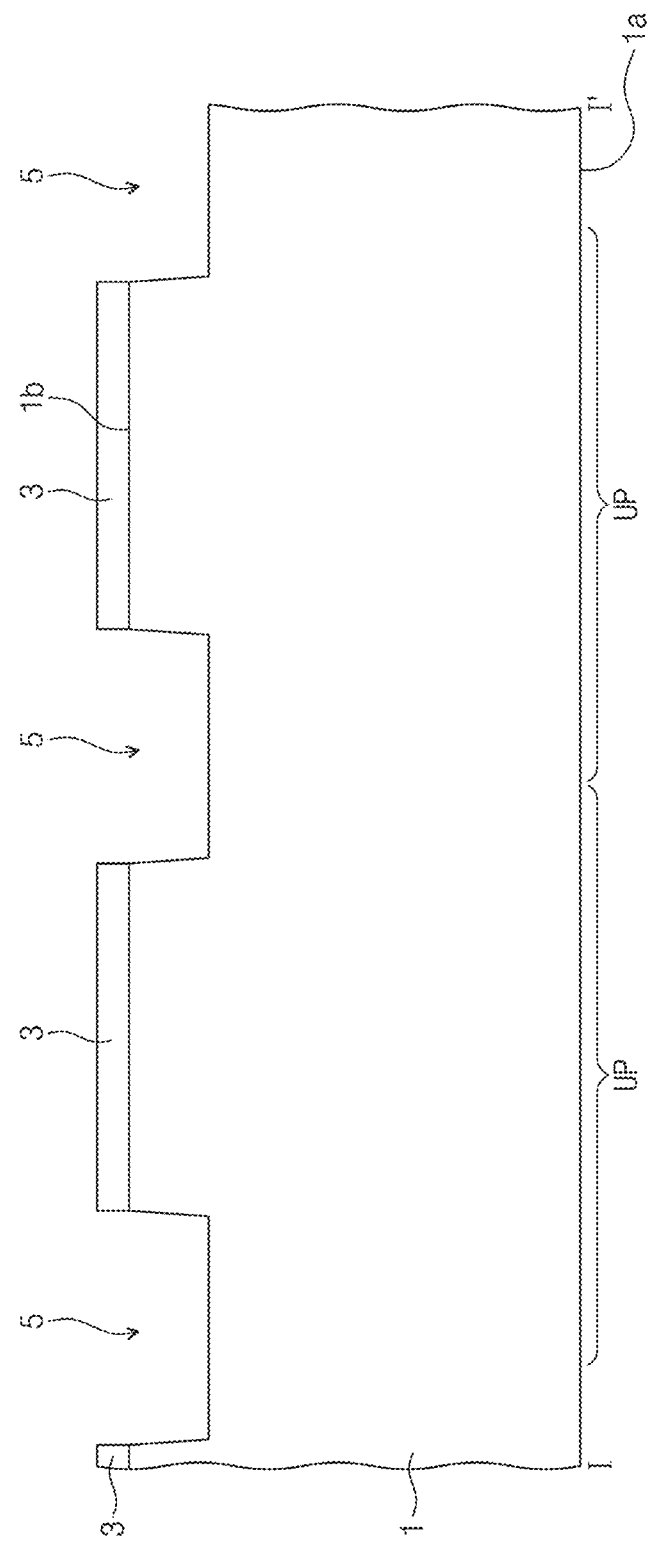
FIGS. 3A to 3J illustrate cross-sectional views showing a method of fabricating an image sensor having the cross-section of FIG. 2 according to an example embodiment.

Referring to FIG. 3A, a semiconductor substrate 1 may be prepared that has a first surface 1a and a second surface 1b facing each other. The semiconductor substrate 1 may be a single crystalline silicon wafer or an epitaxial silicon layer. A first mask layer may be stacked on the second surface 1b of the semiconductor substrate 1, and then patterned to form a first mask pattern 3. The first mask pattern 3 may have an opening that defines a location where a shallow device isolation part is formed, as will be discussed below. The first mask pattern 3 may include, for example, a silicon nitride layer. The first mask pattern 3 may be used as an etching mask to etch the semiconductor substrate 1 to form a shallow trench 5.

Figure 3B:
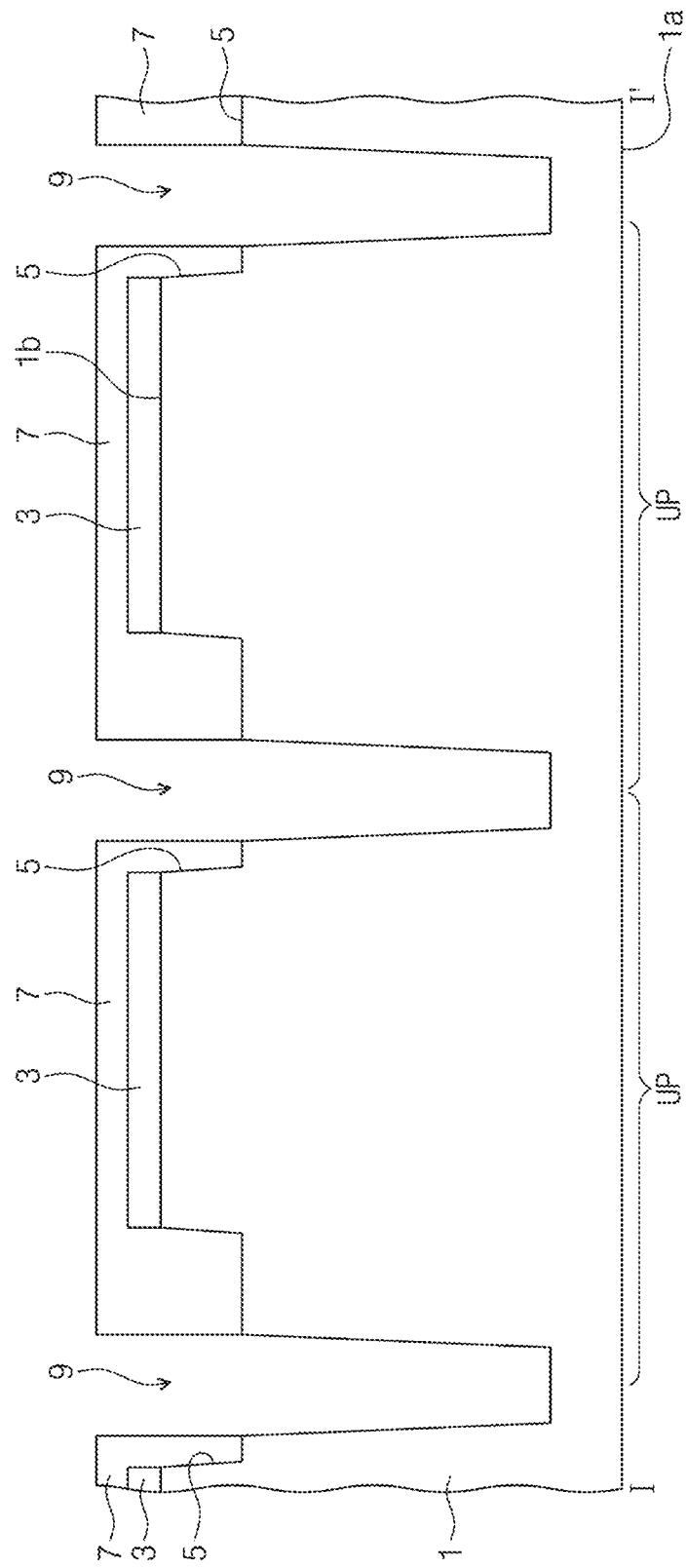

Referring to FIG. 3B, a second mask layer may be stacked on the second surface 1b of the semiconductor substrate 1, and then patterned to form a second mask pattern 7. The second mask pattern 7 may cover the first mask pattern 3. The second mask pattern 7 may include, for example, a silicon oxide layer. The second mask pattern 7 may have an opening that defines a location where a deep trench 9 is formed. The second mask pattern 7 may cover inner sidewalls and a portion of a bottom surface of the shallow trench 5. The second mask pattern 7 may be used as an etching mask to etch the semiconductor substrate 1 to form the deep trench 9.

Figure 3C:
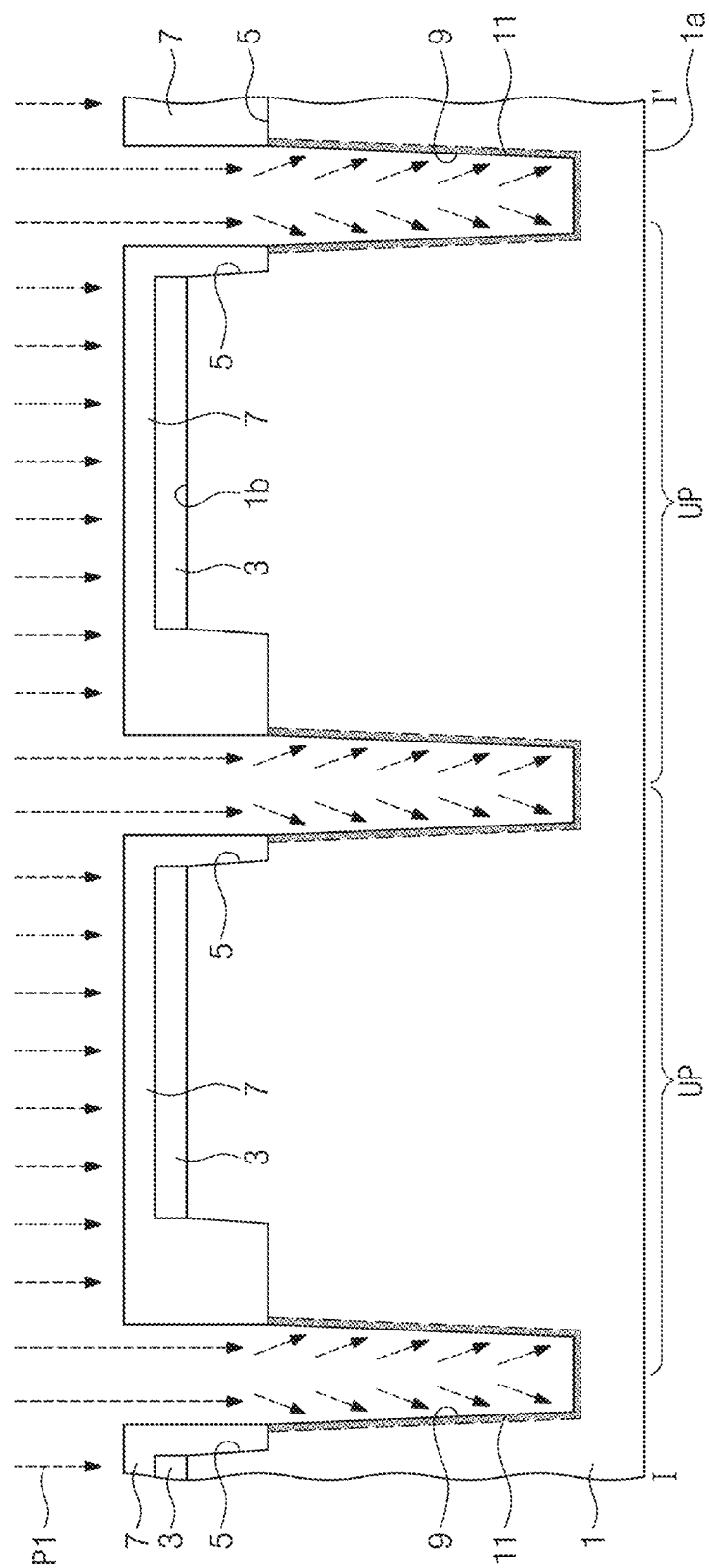

Referring to FIG. 3C, a first plasma doping process P1 may be performed to form a first impurity region 11, which is doped with first impurities of a first conductivity type, in a portion the semiconductor substrate 1 adjacent to a bottom surface and inner sidewalls of the deep trench 9. The first impurities of the first conductivity type may be, for example, N-type arsenic or phosphorus. The first plasma doping process P1 may be executed in such a way that gaseous source materials of arsenic or phosphorus are supplied to a process chamber and then plasma-ionized, and that the semiconductor substrate 1 loaded on an electrostatic chuck is supplied with a high-voltage bias to accelerate cations of arsenic or phosphorus to move into the semiconductor substrate 1. A plasma doping process (e.g., the first plasma doping process P1) may achieve uniform doping even at extremely deep locations and may increase doping speeds. Because the deep trench 9 is relatively narrower and deeper than the shallow trench 5, it may be difficult for a beam line ion implantation process to form the first impurity region 11 whose concentration is uniform along its depth. The first impurity region 11 may be formed to lie spaced apart from the first surface 1a of the semiconductor substrate 1.

Figure 3D:
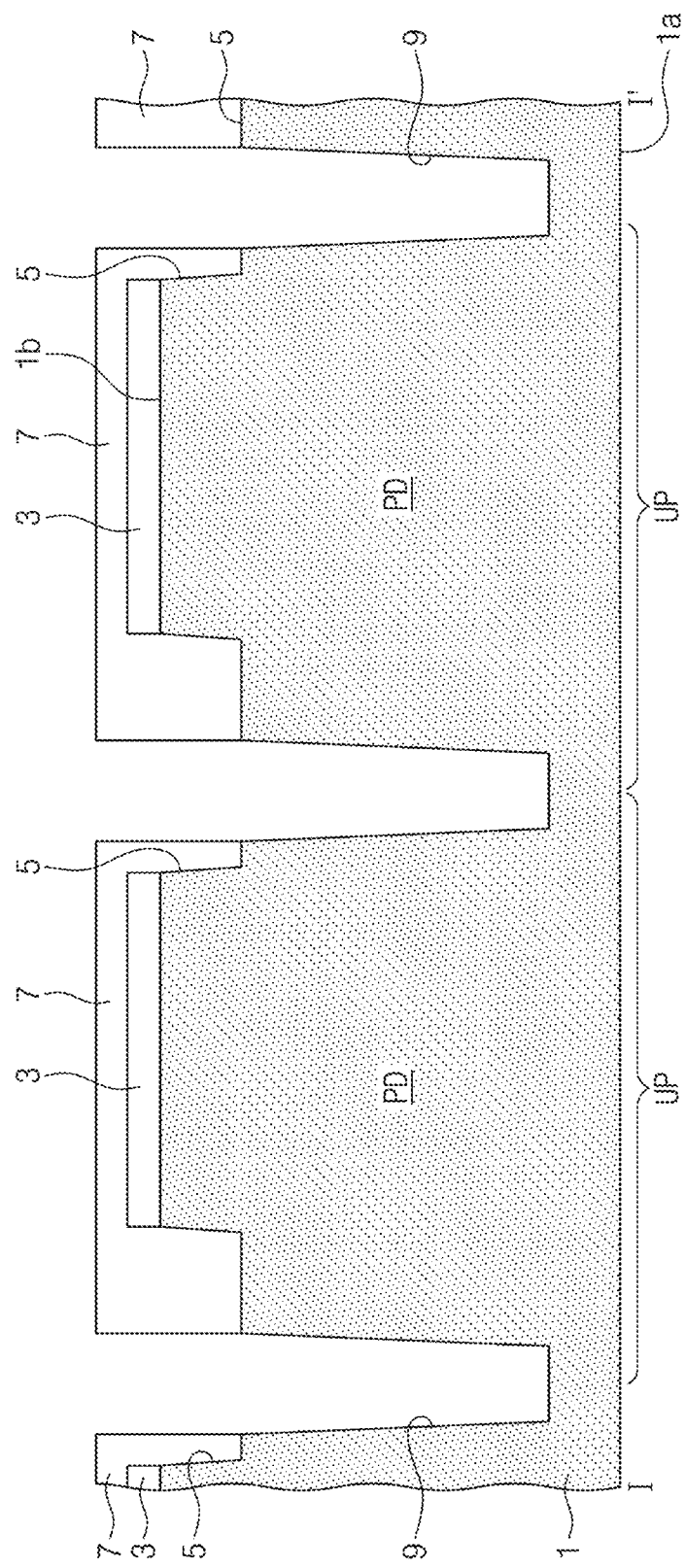

Referring to FIG. 3D, an annealing process may be performed such that the first impurities doped in the first impurity region 11 are used to form a photoelectric conversion part PD. The annealing process may include a first annealing process and a second annealing process. The first annealing process may be performed at a first temperature for a first time duration, and may allow the first impurities doped in the first impurity region 11 to diffuse into the semiconductor substrate 1. The second annealing process may be performed at a second temperature for a second time duration, and may combine the first impurities with semiconductor atoms (e.g., silicon atoms) constituting the semiconductor substrate 1. The first temperature may be less than the second temperature. The first time duration may be greater than the second time duration. The first temperature may be, for example, about 800° C. to about 900° C. The first time duration may be, for example, about two or three hours. The second temperature may be, for example, about 1000° C. The second time duration may be, for example, about 0.001 to 1 second. The first annealing process may be followed by or preceded by the second annealing process. Due to the annealing process, the first impurities doped in the first impurity region 11 may diffuse into the semiconductor substrate 1 (e.g., until a concentration of the first impurities reaches an equilibrium state), and the first impurities may have a regular or uniform concentration along its position in the semiconductor substrate 1. Accordingly, the photoelectric conversion part PD may have the first impurities whose concentration is uniform throughout the photoelectric conversion part PD. The annealing process may be performed under an atmosphere of inert gas, for example, helium or argon.

Figure 3E:
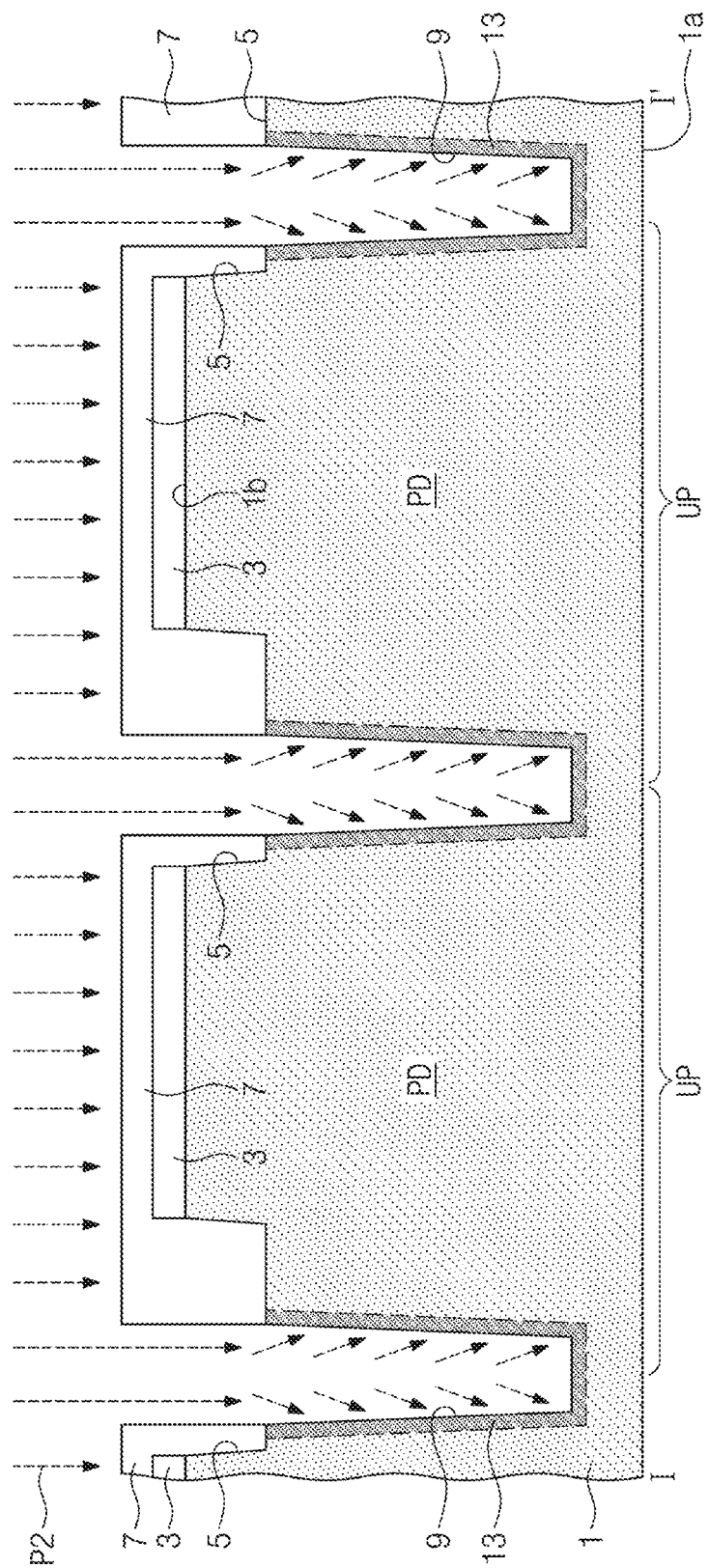

Referring to FIG. 3E, the semiconductor substrate 1 having the photoelectric conversion part PD formed therein may undergo a second plasma doping process P2 to form an electron suppression region 13, which is doped with second impurities of a second conductivity type, in a portion of the semiconductor substrate 1 adjacent to the bottom surface and the inner sidewalls of the deep trench 9. The second impurities of the second conductivity type may be, for example, P-type boron. The second plasma doping process P2 may implant boron ions into the electron suppression region 13. One or more of BF3 and B2H6 may be provided as a source material to implant the boron ions. A process chamber may receive the source material in a gaseous state. When the source material is plasma-ionized and a high-voltage bias is applied to an electrostatic chuck on which the semiconductor substrate 1 is loaded, boron cations of plasma may be accelerated and implanted into the semiconductor substrate 1. In comparison with a beam line ion implantation process, a plasma doping process (e.g., the second plasma doping process P2) may achieve uniform doping even at extremely deep locations and may increase doping speeds.

Figure 3F:
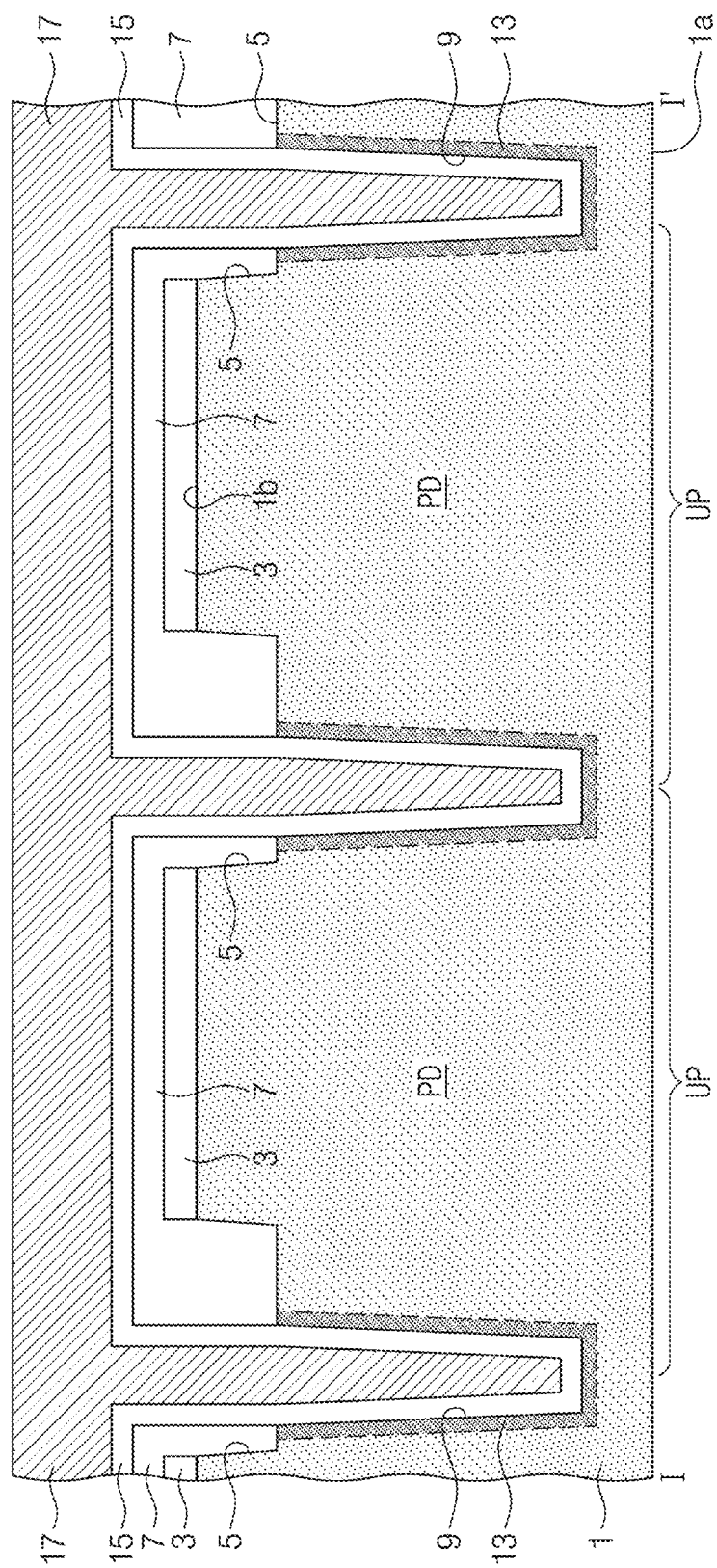

Referring to FIG. 3F, a dielectric layer 15 may be conformally formed on the second surface 1b of the semiconductor substrate 1 to cover the inner sidewalls of the deep trench 9 and also to cover inner sidewalls and a top surface of the second mask pattern 7. A polysilicon layer 17 may be formed on the dielectric layer 15 to fill the deep trench 9.

Figure 3G:
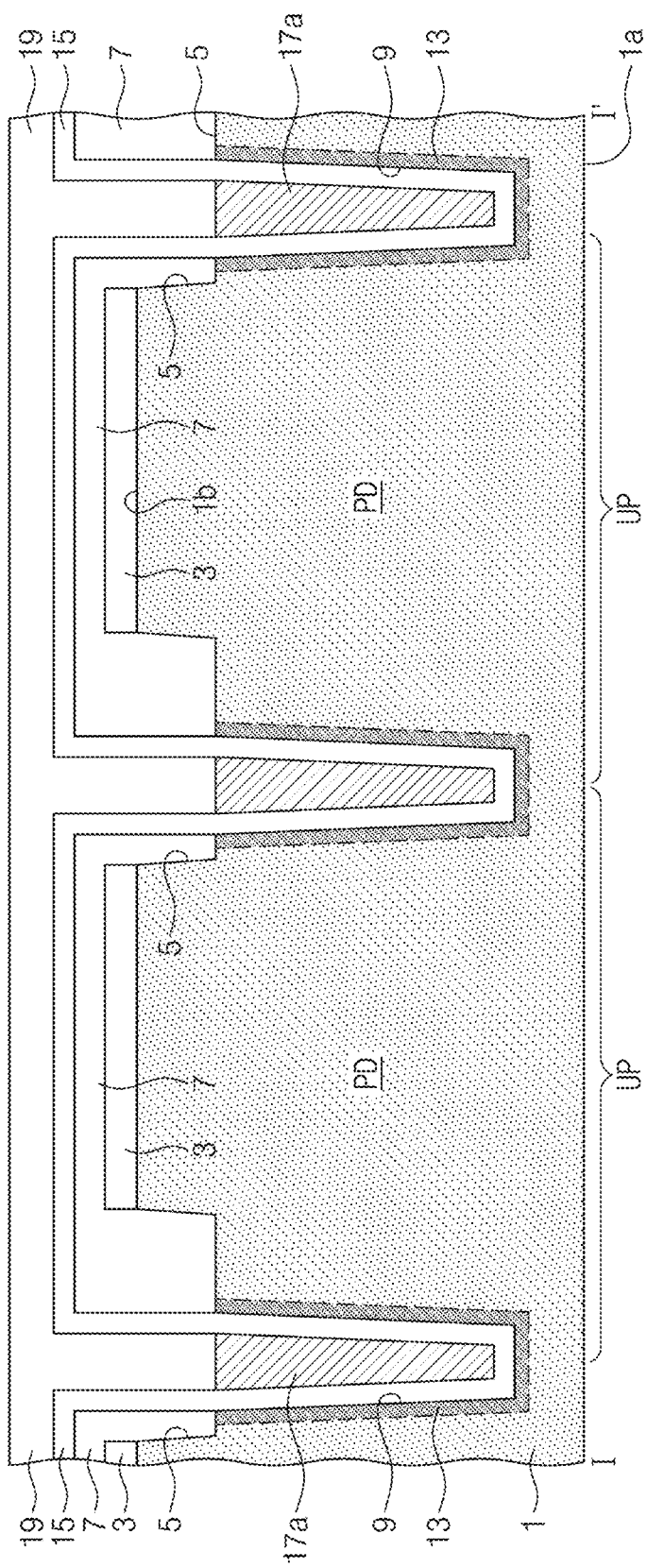

Referring to FIGS. 3F and 3G, an etch-back process may be performed to remove the polysilicon layer 17 on the second mask pattern 7 and to leave a polysilicon pattern 17a in the deep trench 9. The dielectric layer 15 may thus be exposed on its upper sidewall and top surface. A capping layer 19 may be formed on the dielectric layer 15 to fill an upper portion of the deep trench 9.

Figure 3H:
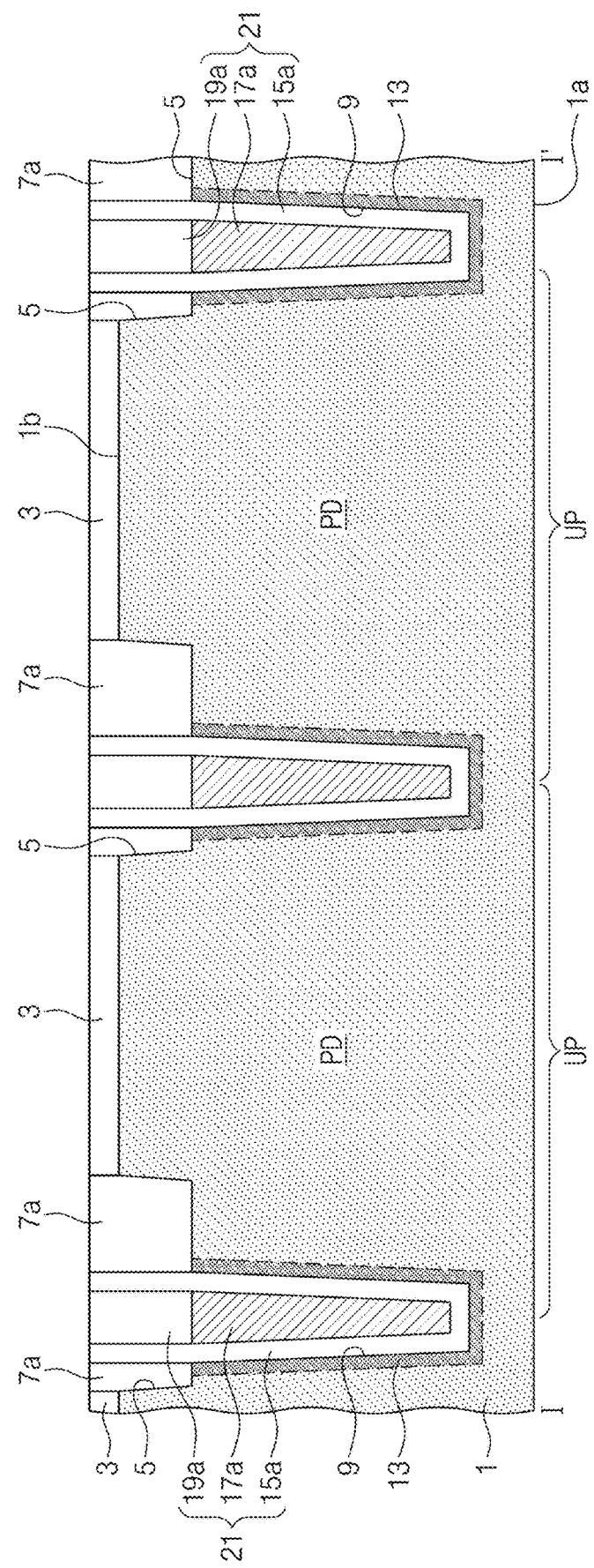

Referring to FIGS. 3G and 3H, a chemical mechanical polishing process or an etch-back process may be performed to remove the second mask pattern 7, the dielectric layer 15, and the capping layer 19 that are formed on the first mask pattern 3. Therefore, the first mask pattern 3 may be exposed on its top surface, and a shallow device isolation part 7a, a dielectric pattern 15a, and a capping pattern 19a may be formed to have their top surfaces coplanar with the top surface of the first mask pattern 3. The dielectric pattern 15a, the polysilicon pattern 17a, and the capping pattern 19a may constitute a deep device isolation part 21.

Figure 3I:
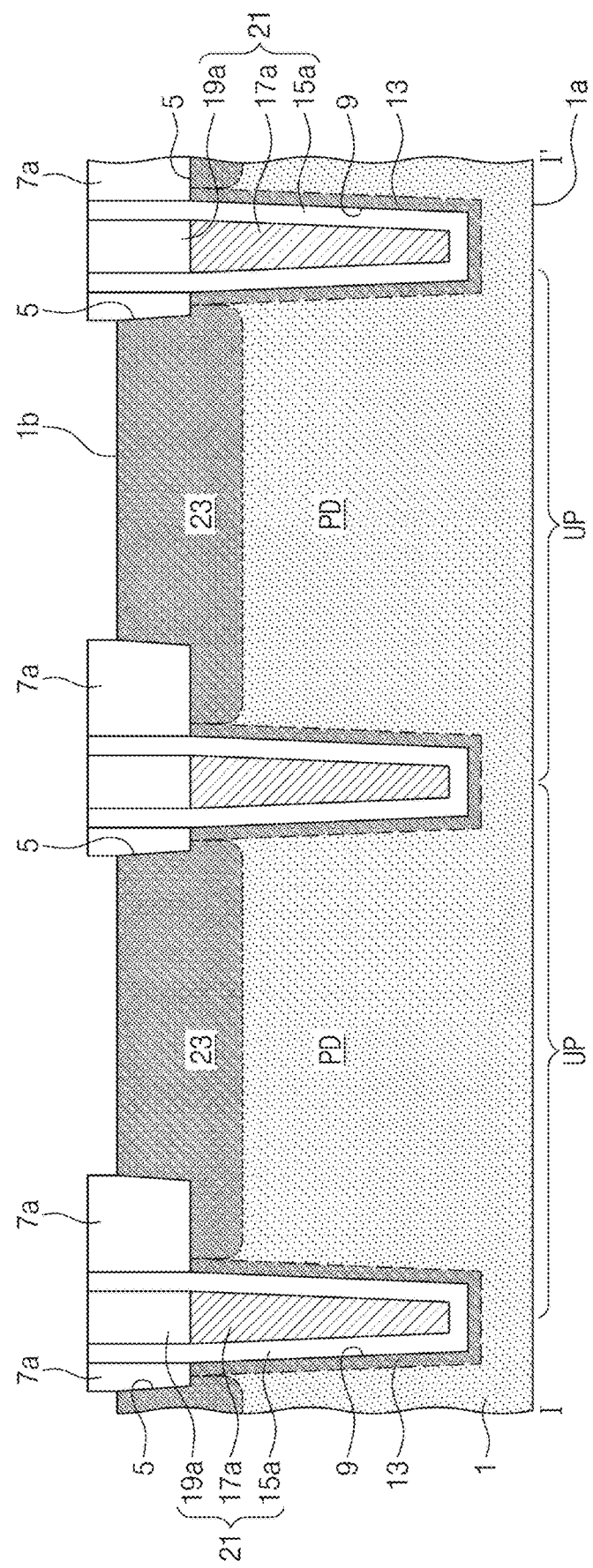

Referring to FIG. 3I, the first mask pattern 3 may be removed to expose the second surface 1b of the semiconductor substrate 1. The shallow device isolation part 7a may be exposed on its upper sidewall. A beam line ion implantation process may be performed several times to form a well region 23 in the semiconductor substrate 1. The well region 23 may be formed by performing a counter doping process that implants second impurities of a second conductivity type opposite to the first conductivity type. The well region 23 may be formed before the removal of the first mask pattern 3. The well region 23 may be formed to contact the electron suppression region 13. The formation of the well region 23 may reduce an area of the photoelectric conversion part PD.

Figure 3J:
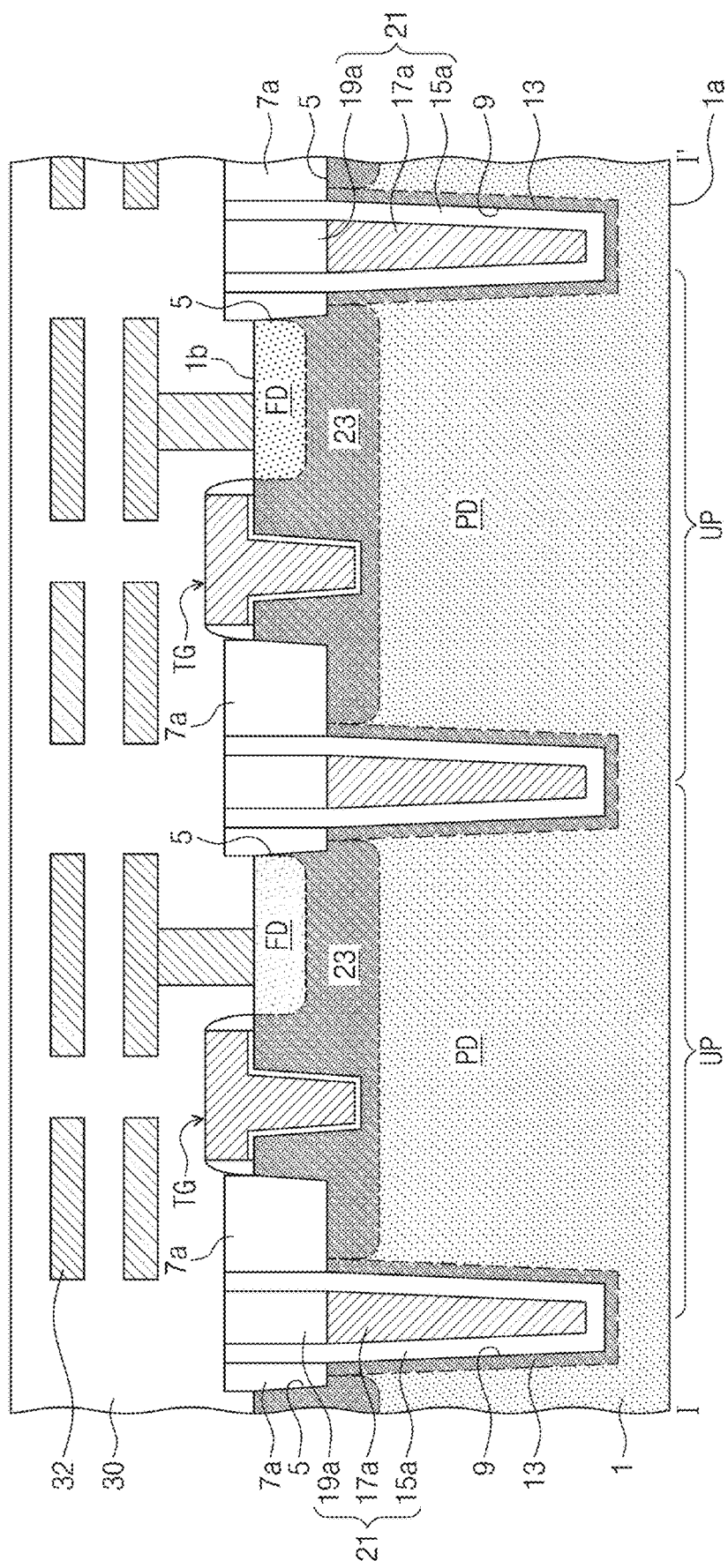

Referring to FIG. 3J, a transfer gate electrode TG may be formed on the second surface 1b of the semiconductor substrate 1. A floating diffusion region FD may be formed in the semiconductor substrate 1 on a side of the transfer gate electrode TG. An interlayer dielectric layer 30 and multi-layered connection lines 32 may be formed on the second surface 1b of the semiconductor substrate 1. Subsequently, a grinding process may be performed to remove portions adjacent to the first surface 1a of the semiconductor substrate 1. In this case, the dielectric pattern 15a below a bottom surface of the polysilicon pattern 17a may also be removed to expose the bottom surface of the polysilicon pattern 17a. A fixed charge layer 34, color filters CF, and micro-lenses ML may be formed subsequently.

According to some example embodiments, a method of fabricating an image sensor may employ a plasma doping process to form the first impurity region 11 and then employ an annealing process to diffuse first impurities, with the result that the photoelectric conversion part PD may be formed to have a regular or uniform concentration throughout the photoelectric conversion part PD.

Figure 4:
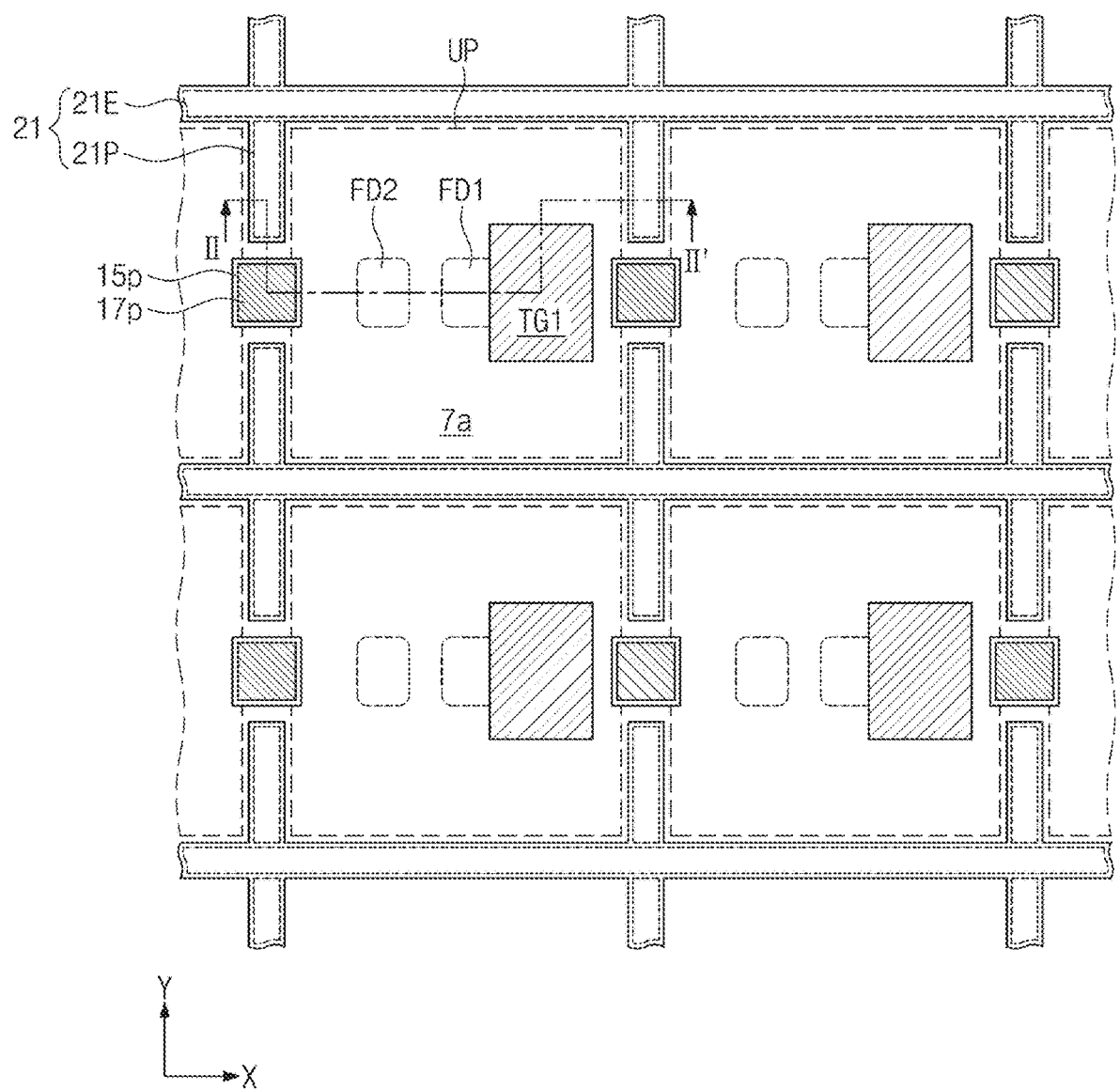
FIG. 4 illustrates a plan view showing an image sensor according to some according to an example embodiment.
Figure 5:
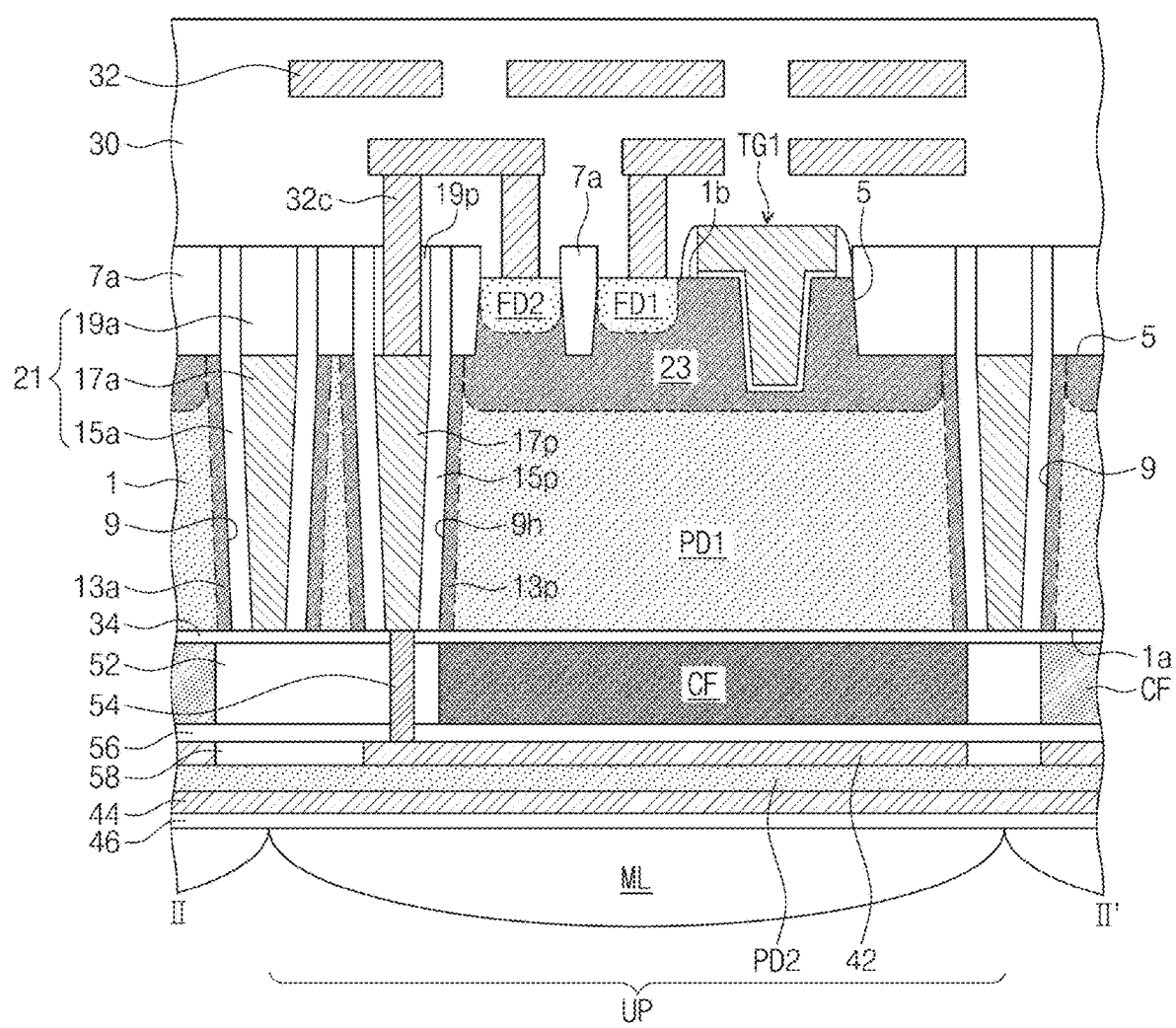
FIG. 5 illustrates a cross-sectional view taken along line II-II' of FIG. 4.

FIG. 4 illustrates a plan view showing an image sensor according to an example embodiment. FIG. 5 illustrates a cross-sectional view taken along line II-II' of FIG. 4.

Referring to FIGS. 4 and 5, in an image sensor according to the present embodiment, the deep device isolation part 21 may include an extension segment 21E that extends in the first direction X and a protrusion segment 21P that protrudes from the extension segment 21E either in the second direction Y intersecting the first direction X or in a reverse direction to the second direction Y. The deep device isolation part 21 may be disposed in the deep trench 9. The deep device isolation part 21 may include the polysilicon pattern 17a, the dielectric pattern 15a (referred to hereinafter as a first dielectric pattern), and the capping pattern 19a (referred to hereinafter as a first capping pattern). A first electron suppression region 13a may be disposed in the semiconductor substrate 1 adjacent to the deep device isolation part 21.

A through electrode 17p may be disposed between protrusion segments 21P neighboring each other in the second direction Y and spaced apart from them. The through electrode 17p may be disposed in a through hole 9h spaced apart from the deep trench 9. The through electrode 17p may have a top surface at a height (or level) that is the same as that of a bottom surface of the shallow device isolation part 7a. A second capping pattern 19p may be disposed on an upper portion of the through electrode 17p. A second dielectric pattern 15p may be interposed between the through electrode 17p and the semiconductor substrate 1 and between the second capping pattern 19p and the semiconductor substrate 1. A second electron suppression region 13p may be disposed in the semiconductor substrate 1 adjacent to the through hole 9h.

The through electrode 17p and the polysilicon pattern 17a may be formed of polysilicon layers doped with the same impurity. The first and second capping patterns 19a and 19p may include the same dielectric layer. The first and second dielectric patterns 15a and 15p may include the same dielectric layer. The first and second electron suppression regions 13a and 13p may be doped with the same impurity at the same concentration.

A first photoelectric conversion part PD1 may be disposed in the semiconductor substrate 1. The first photoelectric conversion part PD1 may be an area doped with first impurities of a first conductivity type. The first impurities in the first photoelectric conversion part PD1 may have a uniform concentration throughout the first photoelectric conversion part PD1. The well region 23 may be disposed on the first photoelectric conversion part PD1. The well region 23 may be in contact with the first and second electron suppression regions 13a and 13p. A first transfer gate electrode TG1 may be disposed on the second surface 1b of the semiconductor substrate 1. A first floating diffusion region FD1 may be disposed in the semiconductor substrate 1 adjacent to the first transfer gate electrode TG1. The semiconductor substrate 1 may be provided therein with a second floating diffusion region FD2 spaced apart from the first floating diffusion region FD1 across the shallow device isolation part 7a. The second surface 1b of the semiconductor substrate 1 may be covered with the interlayer dielectric layer 30. The multi-layered connection lines 32 may be disposed in the interlayer dielectric layer 30. A contact plug 32c may also be disposed in the interlayer dielectric layer 30. The contact plug 32c may penetrate the second capping pattern 19p and contact the through electrode 17p.

The fixed charge layer 34 may be disposed on the first surface 1a of the semiconductor substrate 1. The color filters CF may be disposed in an array format on the fixed charge layer 34. The color filters CF may have red and/or blue colors. A low-refractive pattern 52 may be disposed between the color filters CF. The low-refractive pattern 52 may have a refractive index less than those of the color filters CF. The pixel region UP may receive light incident on an edge of the micro-lens ML, and thus it may be possible to increase light-receiving efficiency and photoelectric efficiency. A shield pattern may be interposed between the low-refractive pattern 52 and the fixed charge layer 34. A first protective layer 56 may be disposed on the color filters CF. Pixel electrodes 42 may be disposed on the first protective layer 56. The pixel electrodes 42 may be separated from each other by an isolation dielectric pattern 58, such that the separated pixel electrodes 42 may be correspondingly provided on the pixel regions UP. A second photoelectric conversion part PD2 may be disposed on the pixel electrodes 42. A common electrode 44 and a second protective layer 46 may be sequentially stacked on the second photoelectric conversion part PD2. The micro-lenses ML may be disposed in an array format on the second protective layer 46. The pixel electrode 42 may be electrically connected to the through electrode 17p through a via plug 54 penetrating the first protective layer 56, the low-refractive pattern 52, and the fixed charge layer 34.

The pixel electrode 42 and the common electrode 44 may include one or more of indium tin oxide (ITO), indium zinc oxide (IZO), zinc oxide (ZnO), and an organic transparent conductive material. The second photoelectric conversion part PD2 may be, for example, an organic photoelectric conversion layer. The second photoelectric conversion part PD2 may include a P-type organic semiconductor material and an N-type organic semiconductor material, which P-type and N-type semiconductor materials may form a p-n junction. Alternatively, the second photoelectric conversion part PD2 may include quantum dots or chalcogenide. For example, the second photoelectric conversion part PD2 may sense a green-colored light to generate charges.

The image sensor discussed with reference to FIGS. 4 and 5 may be an organic CIS (CMOS image sensor). The image sensor may be configured to allow one pixel region UP to simultaneously detect information about light having two colors. Accordingly, it may be provided a highly-integrated image sensor.

Charges generated from the first photoelectric conversion part PD1 may be transferred through the first transfer gate electrode TG1 toward the first floating diffusion region FD1. Charges generated from the second photoelectric conversion part PD2 may be transferred toward the second floating diffusion region FD2 through the via plug 54, the through electrode 17p, and the contact plug 32c. Other configurations may be identical or similar to those discussed above with reference to FIG. 2.

FIGS. 6A to 6D illustrate cross-sectional views showing a method of fabricating an image sensor having the cross-section of FIG. 5 according to an example embodiment.

Figure 6A:
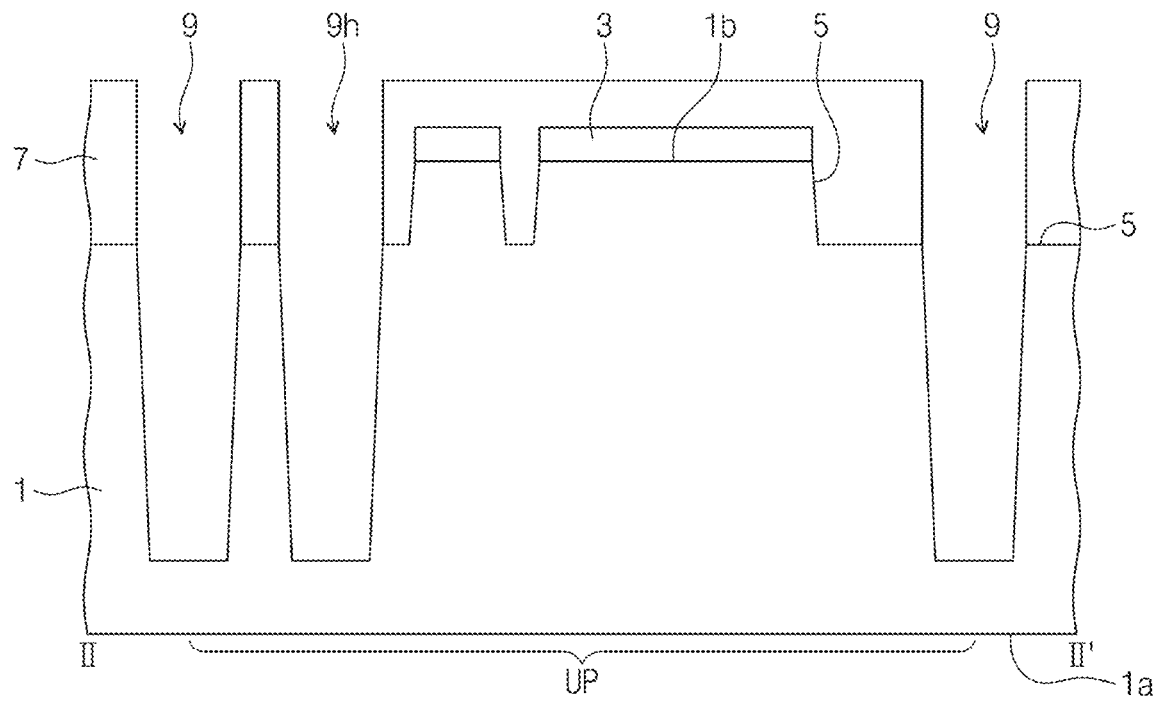
FIGS. 6A to 6D illustrate cross-sectional views showing a method of fabricating an image sensor having the cross-section of FIG. 5 according to an example embodiment.

Referring to FIG. 6A, a semiconductor substrate 1 may be prepared that has a first surface 1a and a second surface 1b facing each other. A first mask pattern 3 may be formed on the second surface 1b of the semiconductor substrate 1. The first mask pattern 3 may be used as an etching mask to etch the semiconductor substrate 1 to form a shallow trench 5. A second mask pattern 7 may be formed on the second surface 1b of the semiconductor substrate 1 having the shallow trench 5 formed therein. The second mask pattern 7 may be used as an etching mask to etch the semiconductor substrate 1 to simultaneously form a deep trench 9 and a through hole 9h. Alternatively, the deep trench 9 and the through hole 9h may be formed by individual etching processes using different mask patterns.

Figure 6B:
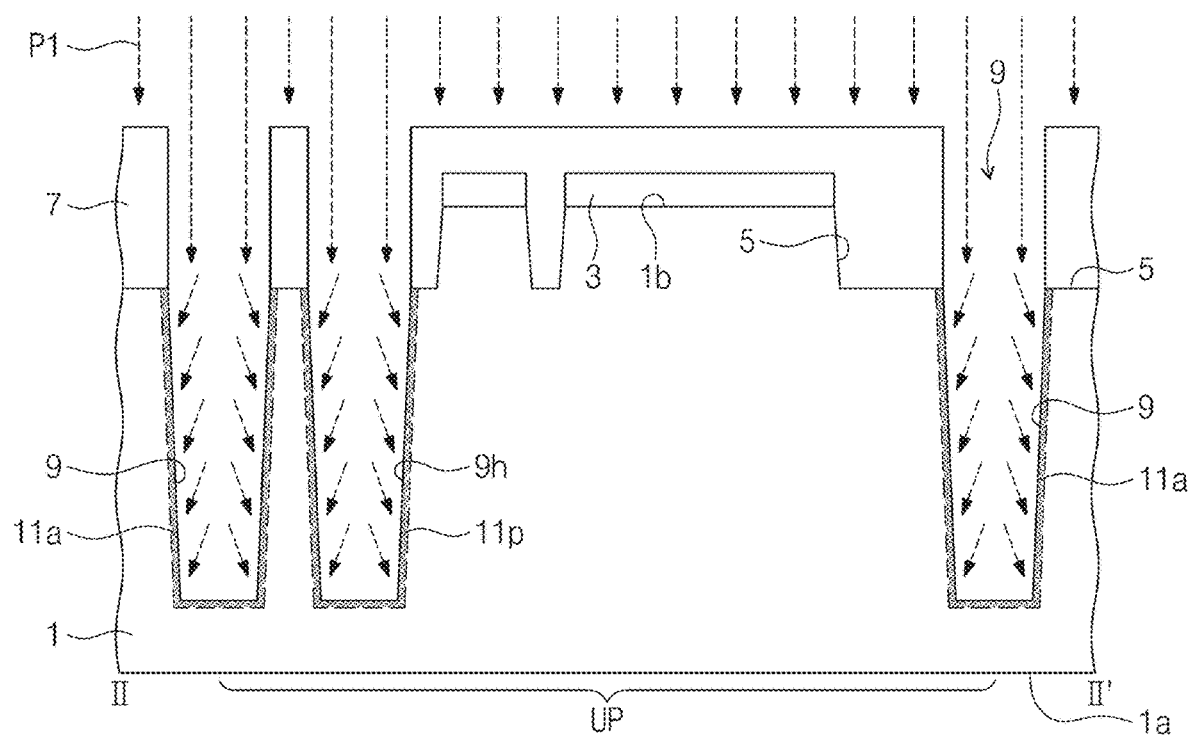

Referring to FIG. 6B, a first plasma doping process P1 may be performed to form a first impurity region 11a, which is doped with first impurities of a first conductivity type, in the semiconductor substrate 1 adjacent to inner sidewalls and a bottom surface of the deep trench 9. A second impurity region 11p may also be formed on the semiconductor substrate 1 adjacent to inner sidewalls and a bottom surface of the through hole 9h. The first and second impurity regions 11a and 11p may be simultaneously formed by implanting the first impurities. The first and second impurity regions 11a and 11p may have the same concentration of the implanted first impurities.

Figure 6C:
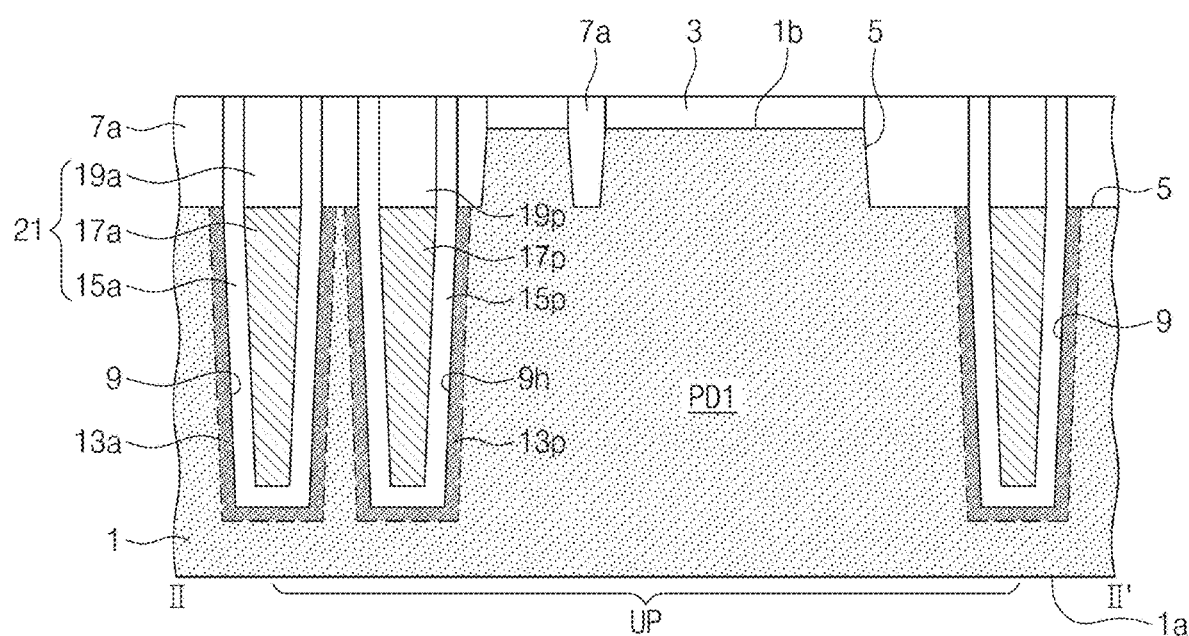

Referring to FIG. 6C, as discussed with reference to FIG. 3D, an annealing process may be performed to allow the first impurities to diffuse from the first and second impurity regions 11a and 11p into the semiconductor substrate 1 and then to activate the first impurities to form a first photoelectric conversion part PD1. The annealing process may include a first annealing process and a second annealing process, as discussed with reference to FIG. 3D. The first impurities in the first photoelectric conversion part PD1 may have a uniform concentration throughout the first photoelectron conversion part PD1.

Successively, as discussed with reference to FIG. 3E, a second plasma doping process may be performed to simultaneously form a first electron suppression region 13a and a second electron suppression region 13p. The first electron suppression region 13a may be formed in the semiconductor substrate 1 adjacent to the inner sidewalls and the bottom surface of the deep trench 9. The second electron suppression region 13p may be formed in the semiconductor substrate 1 adjacent to the inner sidewalls and the bottom surface of the through hole 9h. The first and second electron suppression regions 13a and 13p may be formed by implanting second impurities of a second conductivity type, and may have the same concentration of the implanted second impurities.

As discussed with reference to FIGS. 3F and 3H, subsequent processes may be performed to form a deep device isolation part 21 including a first dielectric pattern 15a, a polysilicon pattern 17a, and a first capping pattern 19a. In addition, there may be formed a second dielectric pattern 15p, a through electrode 17p, a second capping pattern 19p, and a shallow device isolation part 7a.

Figure 6D:
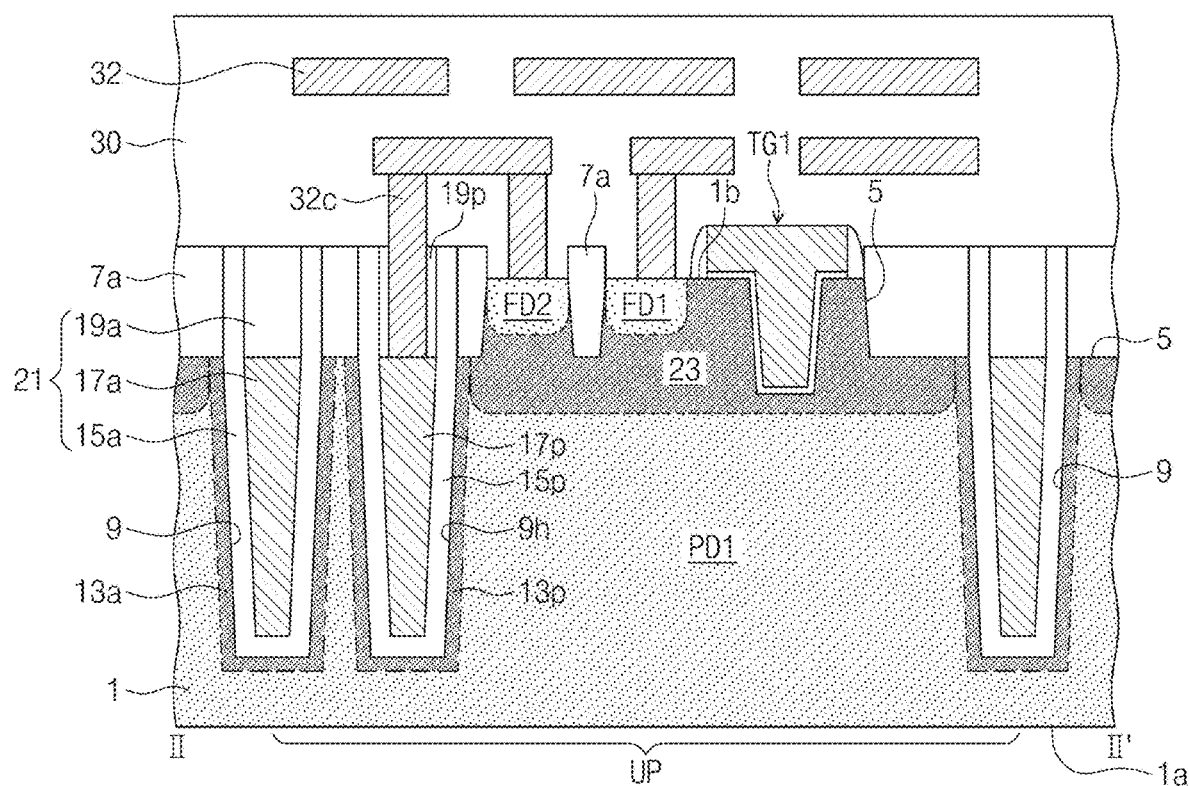

Referring to FIG. 6D, the first mask pattern 3 may be removed. As discussed with reference to FIG. 3I, a well region 23 may be formed in the semiconductor substrate 1. As discussed with reference to FIG. 3J, a first transfer gate electrode TG1 may be formed on the second surface 1b of the semiconductor substrate 1. A first floating diffusion region FD1 and a second floating diffusion region FD2 may be simultaneously formed in the semiconductor substrate 1. Processes identical or similar to those discussed above with reference to FIG. 3J may be subsequently performed.

According to the example embodiments, a method of fabricating an image sensor may form a photoelectric conversion part whose impurity concentration is uniform throughout the photoelectron conversion part.

Although example embodiments have been described, it will be understood to those skilled in the art that various changes and modifications may be made without departing from the technical spirit and essential features of the present disclosure. It will be apparent to those skilled in the art that various substitution, modifications, and changes may be thereto without departing from the scope and spirit of the present disclosure.

What is claimed is:

1. A method of fabricating an image sensor, the method comprising:
   forming a shallow trench in a semiconductor substrate;
   forming a mask pattern covering inner sidewalls and a portion of a bottom surface of the shallow trench, the mask pattern defining a location of a deep trench;
   forming the deep trench in the semiconductor substrate;
   performing a first plasma doping process to form a first impurity region in a portion of the semiconductor substrate adjacent to inner sidewalls and a bottom surface of the deep trench, the first impurity region being doped with first impurities of a first conductivity type; and
   performing an annealing process to diffuse the first impurities from the first impurity region into the semiconductor substrate to form a photoelectric conversion part,
   wherein the forming the deep trench comprises using the mask pattern as an etching mask.

2. The method of claim 1, further comprising, after the performing the annealing process, performing a second plasma doping process to form an electron suppression region in the portion of the semiconductor substrate adjacent to the inner sidewalls and the bottom surface of the deep trench, the electron suppression region being doped with second impurities of a second conductivity type opposite to the first conductivity type.

3. The method of claim 1, wherein the performing the annealing process comprises:
   performing a first annealing process to diffuse the first impurities into the semiconductor substrate; and
   performing a second annealing process to activate the first impurities.

4. The method of claim 3, wherein the first annealing process is performed at a first temperature for a first time duration,
   the second annealing process is performed at a second temperature for a second time duration,
   the first temperature is less than the second temperature, and
   the first time duration is greater than the second time duration.

5. The method of claim 1, further comprising, after the performing the annealing process:
   forming a deep device isolation part in the deep trench; and
   forming a well region provided on the photoelectric conversion part in the semiconductor substrate.

6. The method of claim 5, wherein the forming the deep device isolation part comprises:
   forming a dielectric pattern covering the inner sidewalls and the bottom surface of the deep trench; and
   forming a polysilicon pattern filling the deep trench.

7. The method of claim 1, further comprising, before the performing the first plasma doping process, forming a through hole in the semiconductor substrate, the through hole being spaced apart from the deep trench,
   wherein the first plasma doping process further forms a second impurity region in another portion of the semiconductor substrate adjacent to inner sidewalls and a bottom surface of the through hole, the second impurity region being doped with the first impurities.

8. A method of fabricating an image sensor, the method comprising:
   forming a deep trench in a semiconductor substrate;
   forming a first impurity region in a portion of the semiconductor substrate adjacent to inner sidewalls and a bottom surface of the deep trench, the first impurity region being doped with first impurities of a first conductivity type;
   performing an annealing process to diffuse the first impurities from the first impurity region into the semiconductor substrate to form a photoelectric conversion part; and
   forming an electron suppression region in the portion of the semiconductor substrate adjacent to the inner sidewalls and the bottom surface of the deep trench, the electron suppression region being doped with second impurities of a second conductivity type opposite to the first conductivity type.

9. The method of claim 8, wherein the performing the annealing process comprises:
   performing a first annealing process to diffuse the first impurities into the semiconductor substrate; and performing a second annealing process to activate the first impurities.

10. The method of claim 9, wherein the first annealing process is performed at a first temperature for a first time duration,
the second annealing process is performed at a second temperature for a second time duration,
the first temperature is less than the second temperature, and
the first time duration is greater than the second time duration.

11. The method of claim 8, further comprising, after the performing the annealing process:
forming a deep device isolation part in the deep trench; and
forming a well region provided on the photoelectric conversion part in the semiconductor substrate.

12. The method of claim 8, further comprising, before the performing the annealing process:
forming a through hole spaced apart from the deep trench in the semiconductor substrate; and
forming a second impurity region in another portion of the semiconductor substrate adjacent to inner sidewalls and a bottom surface of the through hole, the second impurity region being doped with the first impurities.

13. A method of fabricating an image sensor, the method comprising:
forming a deep trench and a through hole that are spaced apart from each other in a semiconductor substrate;
forming a first impurity region in a portion of the semiconductor substrate adjacent to inner sidewalls and a bottom surface of the deep trench, the first impurity region being doped with first impurities of a first conductivity type;
forming a second impurity region in another portion the semiconductor substrate adjacent to inner sidewalls and a bottom surface of the through hole, the second impurity region being doped with the first impurities; and
performing an annealing process to diffuse the first impurities from the first impurity region and the second impurity region into the semiconductor substrate to form a photoelectric conversion part.

14. The method of claim 13, after forming the photoelectric conversion part, further comprising:
forming a first electron suppression region in the portion of the semiconductor substrate adjacent to the inner sidewalls and the bottom surface of the deep trench, the first electron suppression region being doped with second impurities of a second conductivity type opposite to the first conductivity type; and
forming a second electron suppression region in the other portion of the semiconductor substrate adjacent to the inner sidewalls and the bottom surface of the through hole, the second electron suppression region being doped with the second impurities.

15. The method of claim 13, wherein the performing the annealing process comprises:
performing a first annealing process to diffuse the first impurities into the semiconductor substrate; and
performing a second annealing process to activate the first impurities.

16. The method of claim 15, wherein the first annealing process is performed at a first temperature for a first time duration,
the second annealing process is performed at a second temperature for a second time duration,
the first temperature is less than the second temperature, and
the first time duration is greater than the second time duration.

17. The method of claim 13, further comprising, after the performing the annealing process:
forming a deep device isolation part in the deep trench;
forming a through electrode in the through hole; and
forming a well region provided on the photoelectric conversion part in the semiconductor substrate.

18. The method of claim 13, wherein the forming the first impurity region and the forming the second impurity region are performed at the same time.

* * * * *